United States Patent [19]

Watanabe et al.

[11] Patent Number: 4,771,395
[45] Date of Patent: Sep. 13, 1988

[54] FIR DIGITAL FILTER

[75] Inventors: Toshihide Watanabe; Kazuyuki Akechi; Satoru Ohmachi; Kiichi Kobayashi, all of Tokyo, Japan

[73] Assignee: Nippon Hoso Kyokai, Tokyo, Japan

[21] Appl. No.: 771,900

[22] Filed: Sep. 3, 1985

[30] Foreign Application Priority Data

Sep. 7, 1984 [JP] Japan ................................ 59-186300

[51] Int. Cl.⁴ ............................................. G06F 7/38
[52] U.S. Cl. ................................................ 364/724.16
[58] Field of Search ........................................ 364/724

[56] References Cited

U.S. PATENT DOCUMENTS 4,489,392 12/1984 Lewis ................................. 364/724
4,533,874 8/1985 Fischer .............................. 364/724

OTHER PUBLICATIONS

"Digital Signal Processing" Prentice-Hall, Inc. Englewood Cliffs, New Jersey, Alan V. Oppenheim.
"Component Coding of Television Signal", Monthly Bulletin of NHK Laboratory, Nov. 1982, pp. 444-451.

Primary Examiner—Gary V. Harkcom
Assistant Examiner—Long Thanh Nguyen
Attorney, Agent, or Firm—Parkhurst & Oliff

[57] ABSTRACT

A FIR digital filter consists of fundamental symmetrical circuits connected in cascade which can be extended with respect to the number of filter orders and the number of input signal digits which can be processed. The fundamental circuits are readily implemented as integrated circuits by suitably inserting controllable gates or resettable registers between principal circuit elements. In addition, the same inserted elements facilitate individual tests of the principal circuit elements and conversion of the fundamental circuits between even number and odd number filter orders.

10 Claims, 12 Drawing Sheets

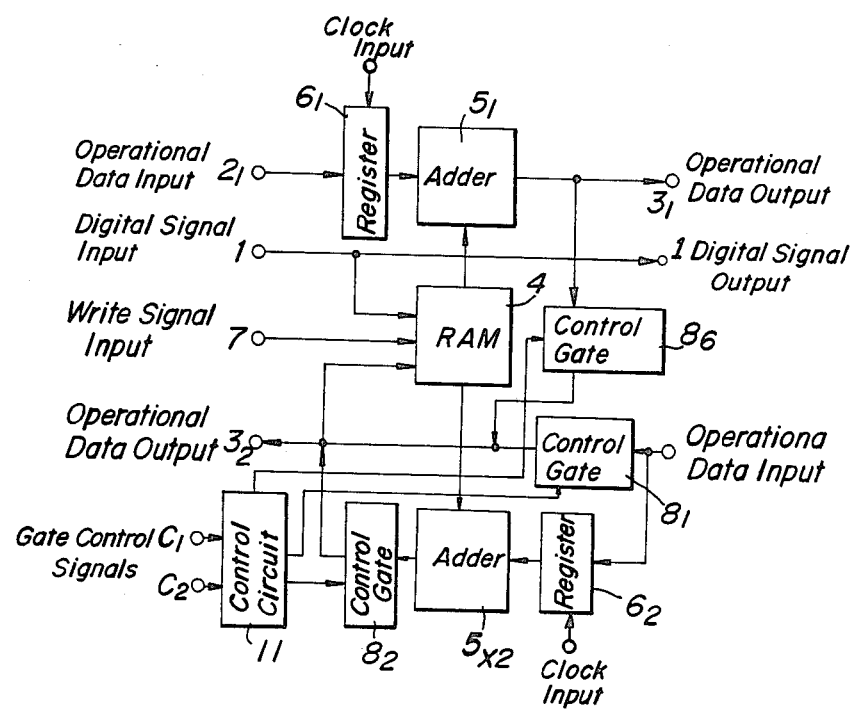

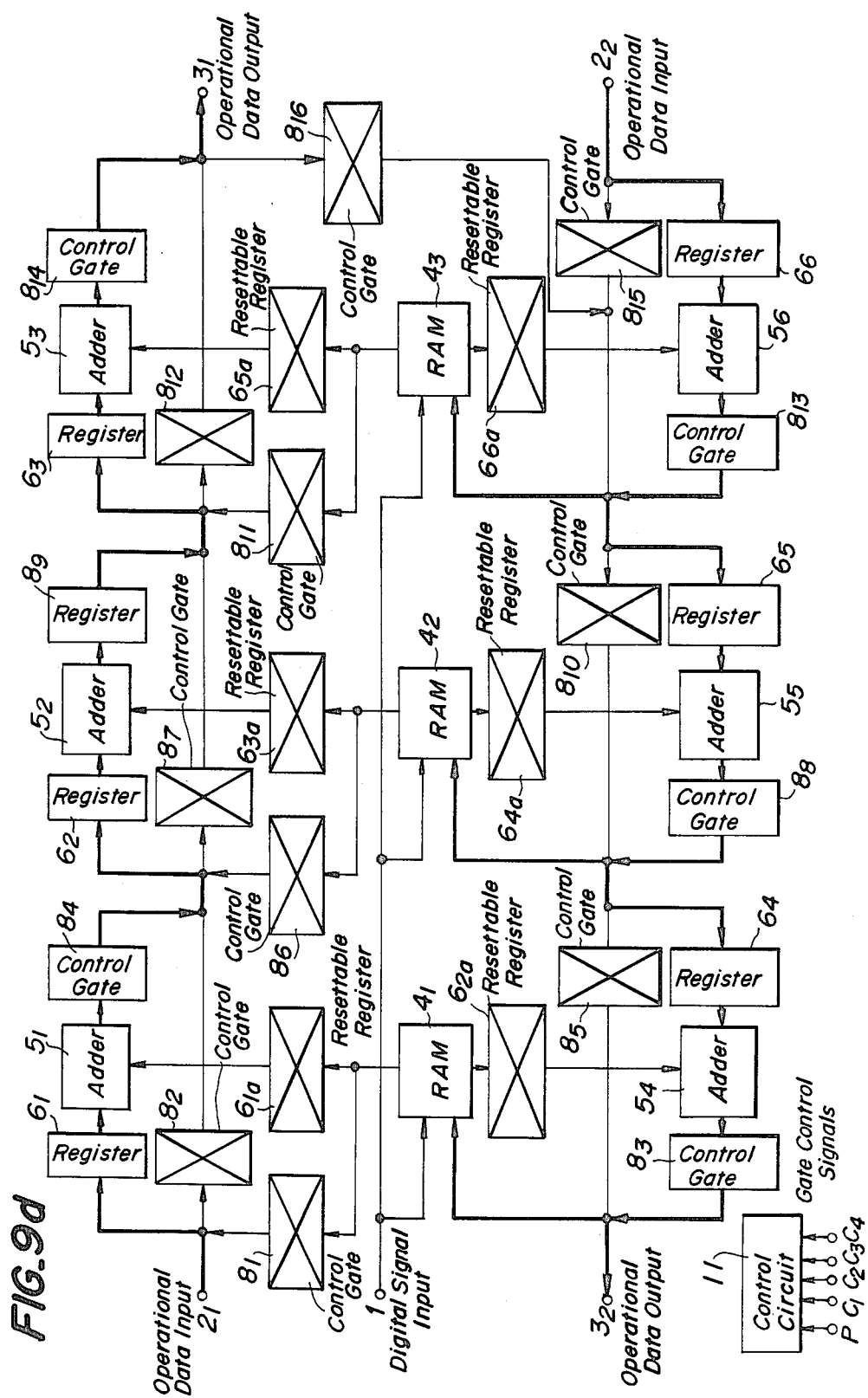

FIR DIGITAL FILTER

BACKGROUND OF THE INVENTION

1. Field of the Invention

The present invention relates to a FIR digital filter which produces a finite impulse response (FIR) based on a finite number of stages of fundamental symmetrical digital filter circuits extendibly and programmably arranged in cascade, and particularly to a FIR digital filter which is efficiently constructed in a configuration adapted for manufacture as a semiconductor integrated circuit.

2. Related Art Statement

In general, the convolution sum behavior of a FIR digital filter can be described by the following equation (1):

$$Y_n = \sum_{k=0}^{N-1} a_k x_{n-k} \quad (1)$$

where $x_n, x_{n-1}, \ldots, x_1$ denote an input signal, $Y_n$ denotes an output signal and $a_0, a_1, \ldots, a_{N-1}$ denote finitely successive degrees or orders of the digital filter, respectively.

The above operation is fundamentally effected by the combination of multiplication, addition and unit delay operations, so that the FIR digital filter can be composed of a combination of multipliers, adders and unit delay elements which are arranged, for instance, as shown in FIG. 1. In the arrangement shown in FIG. 1, $9_1$ to $9_n$ denote multiplication coefficient inputs, $10_1$ to $10_n$ denote mulitpliers, $5_1$ to $5_n$ denote adders and $6_1$ and $6_n$ denote unit delay elements, respectively. With regard to the integrated circuit form of the foregoing FIR digital filter, which was conventionally formed by integrating the fundamental circuit block denoted by the broken line in FIG. 1, it was difficult to realize a large scale integrated circuit (LSI) of the digital filter having low power consumption and high speed operation because of the difficulty of making the required low power, high speed multiplier which has a conventional structure and occupies a small area.

In addition, when the FIR filter is used for the processing of a digital video signal and the like, a symmetrical configuration thereof according to the following equation (2) is frequently employed in general:

$$Y_n = a_0 x_0 + \sum_{k=1}^{(N-1)/2} a_k(x_k + x_{-k}) \quad (2)$$

where N is an odd number.

When this configuration is employed, a symmetrical FIR digital filter can be realized with about half the number of multipliers required for the configuration shown in FIG. 1.

However, when the above described fundamental circuit configuration shown by the broken line in FIG. 1 is employed, a symmetrical FIR digital filter cannot be effectively realized.

For avoiding the above-mentioned shortcomings, another fundamental symmetrical circuit configuration of the FIR digital filter, shown in FIG. 2, has been proposed. In this fundamental circuit configuration, the required results of multiplication between the input signal and the necessary filter coefficients are previously stored in the read only memory (ROM)4, and then are derived therefrom according to the address defined by the input signal as the occasion demands. Consequently, an efficient symmetrical configuration of the FIR digital filter can be achieved by the cascade connection of this fundamental circuit configuration.

However, the read only memory (ROM) which is customarily employed in the foregoing fundamental circuit configuration has a restricted amount of addressable memory capacity, so that the FIR digital filter formed from such cascaded fundamental circuits has the defect that the number of cascaded stages and the choices of selectable filter coefficients are limited, which limits the filter performance characteristics that can be obtained. This defect can be removed by replacing the read only memory (ROM) with a random access memory (RAM). However, when random access memories are employed for the memories 4 in the cascaded fundamental circuit configurations, a group of data inputs 20 and a group of write signal inputs 7 must also be provided to the memories 4, the numbers of which inputs correspond to the number of bits of the necessary operational data, as shown in FIG. 3 (in which the clock inputs have been omitted for the sake of simplicity). Consequently, another defect is created because the number of connection pins required for the integrated circuit embodiment of the cascaded fundamental circuit configuration is substantially increased, and hence the circuit cannot be realized.

Consequently, in those situations where an extendible and programmable FIR digital filter with a symmetrical configuration is employed for processing a digital video signal, an integrated circuit embodiment thereof having low power consumption and high speed operation cannot be realized, so long as the above described conventional circuit configuration is employed.

SUMMARY OF THE INVENTION

An object of the present invention is to provide an FIR digital filter in which the aforesaid various defects are overcome.

Another object of the present invention is to provide a FIR digital filter formed from the extendible cascade connection of a comparatively simple fundamental symmetrical circuit configuration which is adapted for integrated circuit implementation thereof, which has phase linearity, and in which the renewing of the contents of the random access memories provided for efficiently effecting the multiplication between the input data and the filter coefficients in each of the stages in synchronism with the clock signal is facilitated with scarcely any accompanying increase in the number of required interconnection pins between each of the stages.

Still another object of the present invention is to provide a FIR digital filter in accordance with the foregoing in which the fundamental symmetrical circuit configuration can be readily operated as a pipe line which provides isolation between the multiplication and the addition. Further, another object of the present invention is to provide a FIR digital filter in accordance with the foregoing in which the random access memory and the adders provided in assosication therewith for accumulating the result of the multiplication in each stage can be individually tested.

Further, still another object of the present invention is to provide a FIR digital filter in accordance with the foregoing which can be readily interchanged between cascade connection of the even number stages and cascade connection of the odd number stages.

Further, still another object of the present invention is to provide a FIR digital filter in accordance with the foregoing in which extension of the number of the orders of the cascaded filter configuration is facilitated, and to which a simple test pulse sequence can be applied.

Further, still another object of the present invention is to provide a FIR digital filter in accordance with the foregoing in which the number of digits contained in the process data can be readily extended.

For attaining the above described objects, a FIR digital filter according to the present invention comprises a fundamental circuit configuration for cascaded connection having an internal digital signal bus for passing an input digital signal through the fundamental circuit, and a memory for renewably storing plural resultant data generated from the multiplication between plural magnitudes of the input digital signal and plural filter coefficients, the plural resultant data being individually accessible from the memory by being addressed based on the magnitude of the input digital signal. The FIR digital filter fundamental circuit of the present invention further comprises a first register for temporarily storing a first operational datum derived from a preceding stage, a first adder for adding the temporarily stored first operational datum and the resultant datum derived from the memory to each other, so as to form another first operational datum, a second register for temporarily storing a second operational datum derived from a succeeding stage, a second adder for adding the temporarily stored second operational datum and the resultant datum derived from the memory to each other, so as to form another second operational datum, a first control gate connected to an internal data bus for controlling passage of the second operational datum derived from the succeeding stage through the fundamental circuit, a second control gate for controlling connection of the second operational datum formed by the second adder as an output, and a control circuit for controlling the first and second control gates.

BRIEF DESCRIPTION OF THE DRAWINGS

To aid in understanding the invention, reference is made to the accompanying drawings in which:

FIGS. 6, 7 and 8 are block diagrams showing modified embodiments of fundamental circuit configurations of a FIR digital filter according to the present invention;

Figure 1:
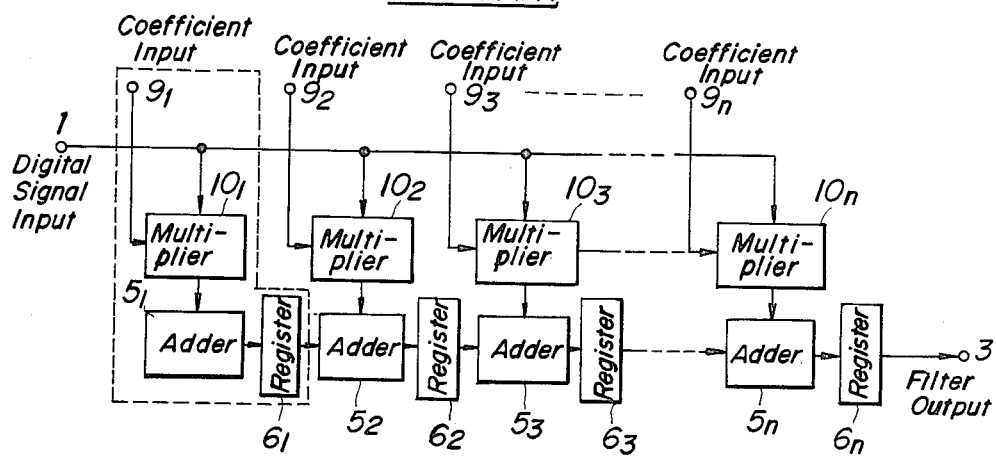
FIGS. 1, 2 and 3 are block diagrams showing first, second and third conventional fundamental circuit configurations of a FIR digital filter, respectively.

Throughout the different figures of the drawings, the reference numeral 1 denotes an input digital signal input, $2_1$ and $2_2$ denote operational data inputs, $3_1$ and $3_2$ denote operational data outputs, 4, $4_1$, $4_2$ and $4_3$ denote memories (ROM, RAM), $5_1$ to $5_n$ denote adders, $6_1$ to $6_n$ denote registers, 7 denotes a write signal input, $8_1$ to $8_{16}$ denote control gates, $9_1$ to $9_n$ denote filter coefficient inputs, $10_1$ to $10_n$ denote multipliers, 11 and $11_1$ to $11_3$ denote control circuits, 20 denotes a group of data inputs, P denotes a write signal and $C_1$ to $C_4$ denote gate control signals.

DETAILED DESCRIPTION OF PREFERRED EMBODIMENTS

Figure 4:
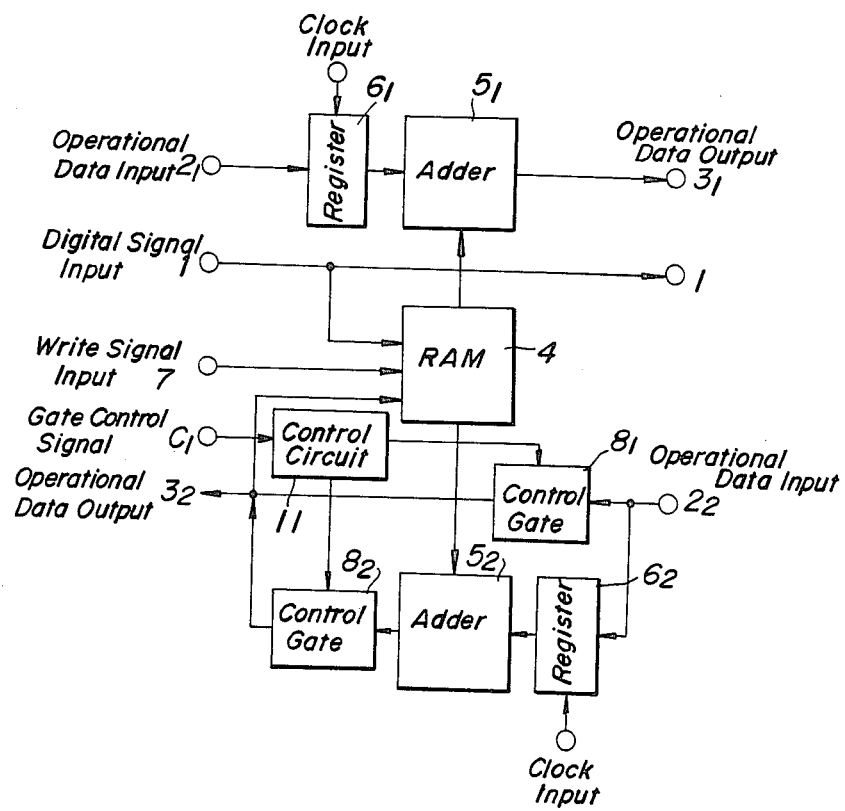
FIGS. 4 and 5 are block diagrams showing, respectively, a first fundamental circuit configuration embodiment and three cascaded stages thereof in a FIR digital filter according to the present invention.

FIG. 4 shows a basic example of a fundamental symmetrical circuit configuration for a FIR digital filter according to the present invention which is programmable and adapted for integrated circuit implementation.

The fundamental circuit shown in FIG. 4 comprises an internal digital signal bus connected between digital signal inputs 1 connected to preceding and succeeding stages respectively; an internal data bus connected between an operational data input $2_2$ and an operational data output $3_2$ through a bus control gate $8_1$; a memory (RAM)4 for renewably storing plural resultant data generated by the multiplication between plural magnitudes of the input digital signal and plural filter coefficients; a register $6_1$ for temporarily storing a first operational datum derived from a preceding stage; an adder $5_1$ for adding the temporarily stored first operational datum and the resultant datum derived from the memory 4 to each other; a register $6_2$ for temporarily storing a second operational datum derived from a succeeding stage; an adder $5_2$ for adding the temporarily stored second operational datum and the resultant datum from the memory 4 to each other; the control gate $8_1$, which controls passage of the second operational datum derived from the succeeding stage between the operational data input $2_2$ to the operational data output $3_2$ of the fundamental circuit of which the control gate $8_1$ is a part; a control gate $8_2$ for controlling connection of the second operational datum formed by the adder $5_2$ as an output; and a control circuit 11 for controlling the control gate $8_1$ and $8_2$.

Figure 2:
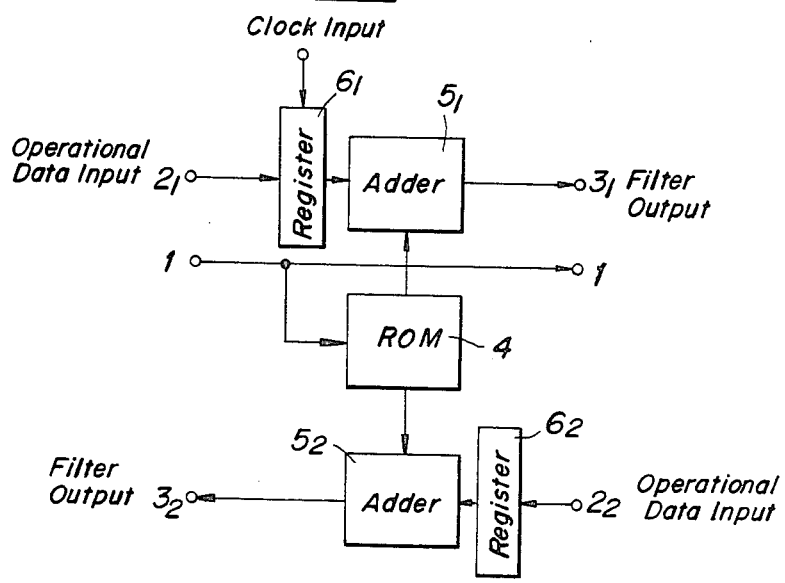

The fundamental circuit shown in FIG. 4 performs the same operation as that performed by the conventional circuit configuration shown in FIG. 2 when the control gate $8_1$ is OFF, the control $8_2$ is ON and, further, the write signal inputted to the memory 4 from a write signal input 7 is OFF. In order to store new data in the memory 4, as well as to program the filter coefficients, the control gate $8_1$ is ON and the control $8_2$ is OFF, so that the operational data inputted to the memory 4 through the operational data input $2_2$ is stored therein in response to the write signal inputted thereto through the associated input 7.

More specifically, the entry of new data memorized in the memory (RAM)4 is effected as indicated in the following Table 1, with reference to FIG. 4.

TABLE 1

| | (Relating to FIG. 4) | | |
|---|---|---|---|
| Gate control signal ($C_1$) | Control gate $8_1$ | Control gate $8_2$ | Remarks |
| 0 | OFF | ON | The same operation as shown in FIG. 2 |
| 1 | ON | OFF | New data is stored |

TABLE 1-continued

| (Relating to FIG. 4) | | | |
|---|---|---|---|
| Gate control signal ($C_1$) | Control gate $8_1$ | Control gate $8_2$ | Remarks |
| | | | in memory 4 |

That is, the process of storing new data in the memory 4 is carried out as follows.

When the gate control signal $C_1=1$, the control gate $8_1$ is ON, and the control gate $8_2$ is OFF. Under these conditions, a selected memory address of the memory (RAM)4, in which the datum to be replaced by a new datum is stored, is accessed in accordance with the magnitude of the input digital signal applied thereto through the associated input 1. Thereafter, at a predetermined timing, the data applied to the memory 4 through the associated input $2_2$ is written therein in response to the write signal applied to the memory 4 through the associated input 7.

Figure 5:
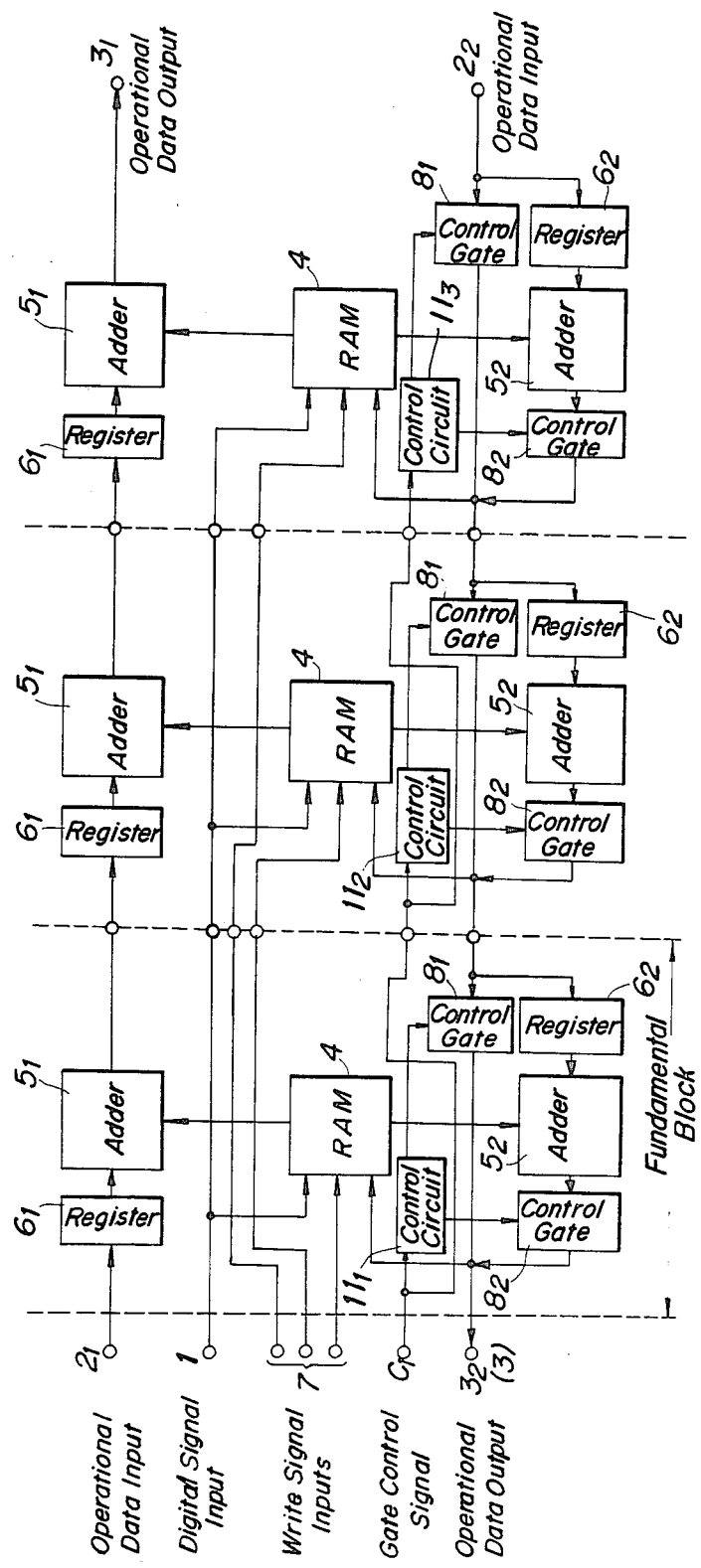

Three stages of the fundamental circuit shown in FIG. 4 may be connected in cascade, as shown in FIG. 5, so as to permit integrated circuit implementation of a FIR digital filter according to the invention. As is apparent from a comparison of the FIG. 5 filter with the conventional configuration shown in FIG. 3, the number of terminals required for external connection is reduced, particularly with respect to the terminals required for entry of new data in the memories 4. As the number of cascaded stages increases, the advantage of the reduction in external terminals becomes increasingly greater.

Figure 3:
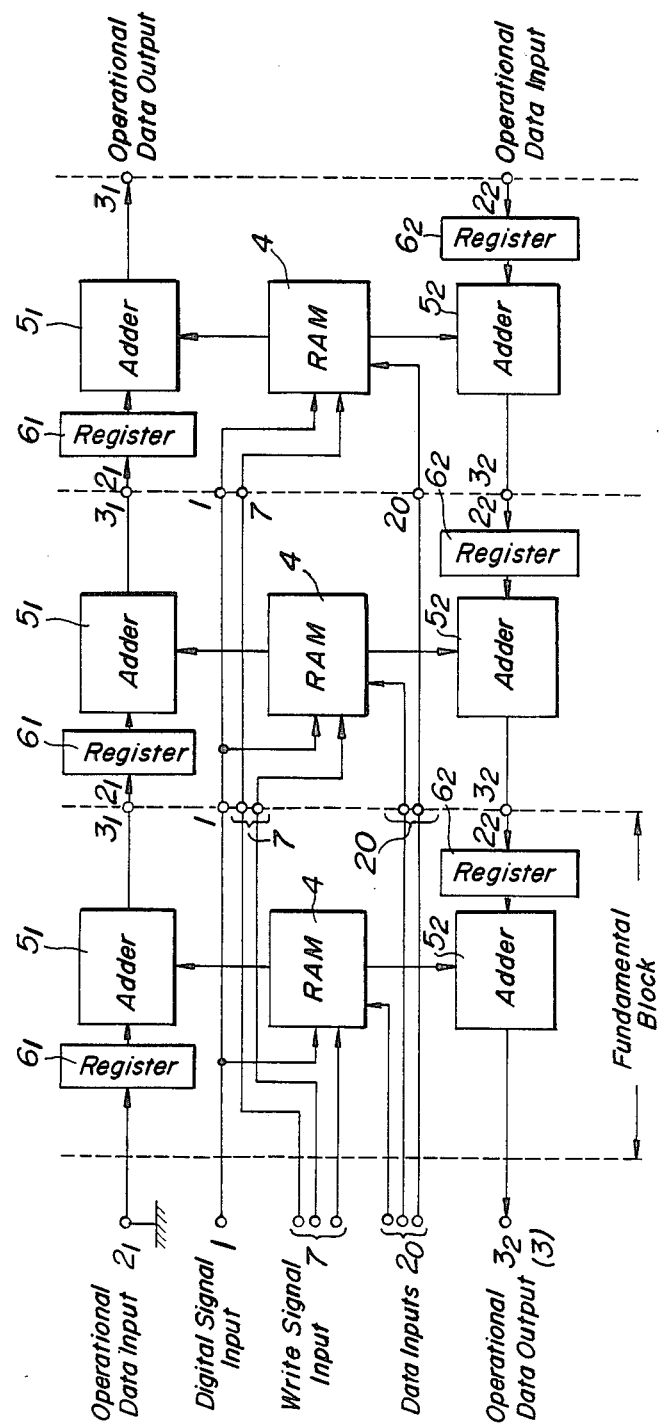

Specifically, in each of the stages shown in FIG. 5, in which clock inputs have been omitted for the sake of simplicity, new data is applied to the memory (RAM)4 from the input $2_2$ through the control gate $8_1$ and is individually written into the memory 4, so that the group of data inputs 20 required for the conventional cascaded configuration shown in FIG. 3 is not required. Hence, the filter of FIG. 5 can be readily implemented as an integrated circuit.

In addition, as described later, the fundamental configuration shown in FIG. 4 can be adapted to operate with a four bit digital signal input. For example, a digital video signal formed of 8 bits can be processed by dividing the signal into two blocks of 4 bits. In a similar fashion, a symmetrical FIR digital filter having any number of orders and digits can be efficiently provided using the fundamental circuit shown in FIG. 4 in accordance with the present invention.

Next, the aforesaid reduction of the number of write signal input terminals required for providing timed entry of new data will be described in more detail.

In the case of a digital FIR filter according to the invention having four stages of the fundamental circuit shown in FIG. 4 connected in cascade similarly to the FIG. 5 embodiment, a group of four write signal inputs 7 corresponding to the number and stages are required, similarly to the three write signal inputs required for the three stage embodiment shown in FIG. 5. However, if an additional control circuit, which is operated according to the truth table shown in Table 2, is provided within the integrated circuit for the digital filter, the number of external terminals necessitated for defining the timing of the storage of new data can be reduced to three terminals. In other words, the number of cascaded stages for which the timing of new data storage can be controlled by the additional control circuit is increased to 4, 8, 16 and so on more than the number of external terminals 3, 4, 5 and so on, respectively, which are required for the additional control circuit. That is, the number of reducible terminals can be increased by 1, 4, 11 and so on in comparison with the number of terminals shown in the FIG. 5 embodiment. Consequently, even if the situation where no new data is entered in any of the memories 4 is added to the conditions shown in Table 2, the number of cascaded stages within the integrated circuit which are subject to control by a control circuit having 3, 4, 5 and so on control signal inputs becomes 3, 7, 15 and so on, respectively.

TABLE 2

(Truth Table for four cascaded stages of the fundamental circuit shown in FIG. 4 and provided with three write signal inputs)

| $7_1$ | $7_2$ | $7_3$ | RAM1 | RAM2 | RAM3 | RAM4 |
|---|---|---|---|---|---|---|
| P | 0 | 0 | W | — | — | — |
| P | 1 | 0 | — | W | — | — |
| P | 0 | 1 | — | — | W | — |
| P | 1 | 1 | — | — | — | W |

In connection with Table 2, numerical symbols $7_1$, $7_2$ and $7_3$ denote the respective individual write signal inputs, the symbol P denotes a pulse indicating the timing of the writing, symbols RAM1 to RAM4 denote the respective memories which are subject to new data entry, and the symbol W denotes the specific memory in which data is to be entered in response to the write signal applied through the input $7_1$.

Further in connection with Table 2, the conditions of the control gates $8_1$ and $8_2$ and the function of the digital signal inputs 1 are the same as described for the circuit shown in FIG. 4.

Figure 6:
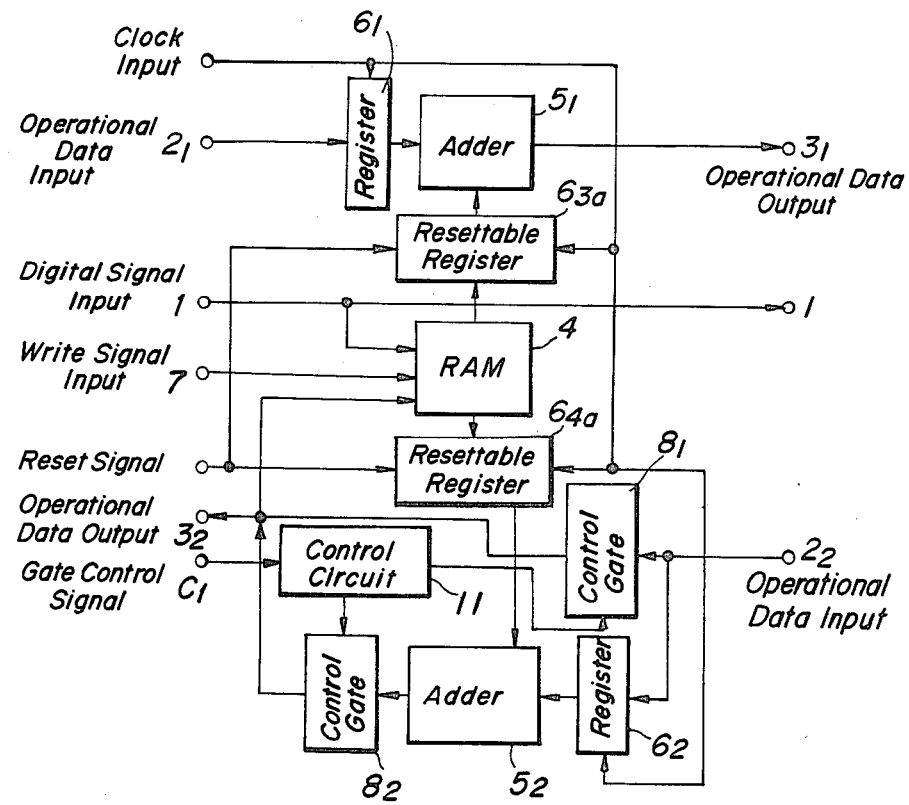

Next, FIG. 6 shows another embodiment of the fundamental circuit of the present invention in which two resettable registers are additionally provided to the basic circuit shown in FIG. 4, which allow the fundamental circuit to be operated at a higher clock frequency as a pipeline providing isolation between the memory and the adder. In the fundamental circuit embodiment shown in FIG. 6, the operations indicated in Table 3 can be realized by additionally providing resettable registers $63_a$ and $64_a$ together with a reset signal input. As is apparent from Table 3, in the situation where the control signal $C_1=0$ and the reset signal is 1, the operational data applied from the input $2_2$ is passed through the output $3_2$ through the register $6_2$, the adder $5_2$ and the control gate $8_2$ in response to a clock signal. In this situation, when the input digital signal is applied to the memory 4 as the address data from the input 1, the above operational data are written in the memory 4 in response to the write signal applied to the memory 4 from the associated input 7.

In other words, according to the operations indicated in Table 3, the writing of the operational data in the memory 4 in synchronism with the clock signal is facilitated, and the memory 4 and the adders $5_1$ and $5_2$ are isolated from each other as well, by the resettable registers $63_a$ and $64_a$, respectively. As a result, the fundamental circuit embodiment shown in FIG. 6 is operated as a pipeline for the applied operational data, so that high speed operation of such circuits connected in cascade can be obtained.

TABLE 3

| | | (Relating to FIG. 6) | | |
|---|---|---|---|---|
| $C_1$ | Reset signal | $8_1$ | $8_2$ | Remarks |
| 0 | 0 | OFF | ON | Ordinary filter operation |
|   | 1 | OFF | ON | Clock synchronized writing at output 0 of resettable registers $63_a$ and $64_a$ |
| 1 | any of 0 and 1 | ON | OFF | Data writing |

Figure 7:
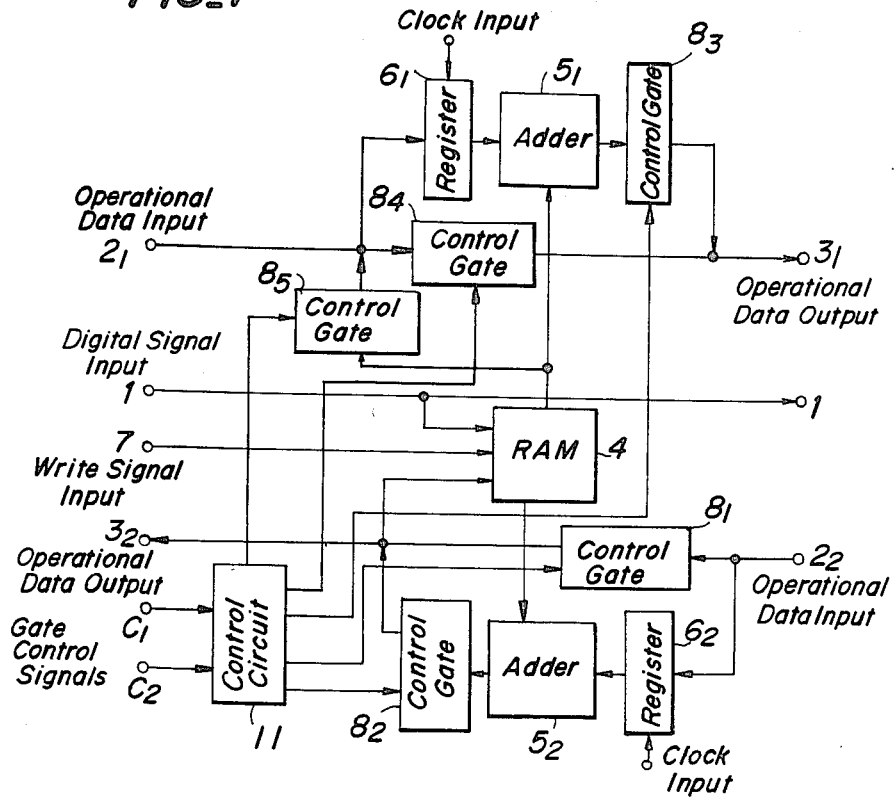

Next, still another embodiment of the fundamental circuit of the present invention is shown in FIG. 7, in which the circuit is configured to permit testing of the contents of the memory 4 and the operation of the adders $5_1$ and $5_2$. The FIG. 7 embodiment will be further described by referring to Table 4.

TABLE 4

| | | | (Relating to FIG. 7) | | | | |
|---|---|---|---|---|---|---|---|
| $C_1$ | $C_2$ | $8_1$ | $8_2$ | $8_3$ | $8_4$ | $8_5$ | Remarks |
| 0 | 0 | OFF | ON | ON | OFF | OFF | Ordinary filter operation |
| 1 | 0 | ON | OFF | OFF | ON | ON | Writing and test for memory |
| 0 | 1 | OFF | ON | ON | OFF | OFF | Test for adder |

As is apparent from Table 4, in a situation where the gate control signals $C_1=1$ and $C_2=0$, the operational data is applied to the memory 4 through the input $2_2$, the address is applied thereto to the input 1 and the write signal is applied thereto through the input 7, so that new data can be entered in the memory 4. In this situation, the operational data already stored in the memory 4 can be monitored through the output $3_1$ in response to address data applied to the memory without the write signal applied thereto through the input 7. To test the adders $5_1$ and $5_2$, after the above test of the memory 4, adder test data (A) is stored in the adders, other test data (B) and (C) are then applied thereto through the inputs $2_1$ and $2_2$, respectively. The resultant additions (A+B) and (A+C) effected in the adders $5_1$ and $5_2$, respectively, can be tested by individually monitoring the resultant sums through the outputs $3_1$ and $3_2$, respectively.

Next, a further embodiment of the fundamental circuit of the present invention is shown in FIG. 8, in which the control circuitry is configured for facilitating the change of the cascade connection of the FIR digital filter from cascaded even number stages to cascaded odd number stages without the need for any additional external connection. The FIG. 8 embodiment will be further described with reference to Table 5.

TABLE 5

| | | | (Relating to FIG. 8) | | |
|---|---|---|---|---|---|
| $C_1$ | $C_2$ | $8_1$ | $8_2$ | $8_6$ | Remarks |
| 0 | 0 | OFF | ON | OFF | Even number stage filter operation |
| 1 | 0 | ON | OFF | OFF | Writing for memory |
| 0 | 1 | OFF | OFF | ON | Odd number stage filter operation |

As is apparent from Table 5, in a situation where control inputs $C_1=0$, $C_2=0$ or $C_1=1$, $C_2=0$, the aforesaid filter operations are effected. However, in the situation where $C_1=0$, $C_2=1$, the resultant sum derived from the adder $5_2$ is taken from the output $3_2'$ through the control gate $8_6$, so that the filter degree presented by the fundamental circuit becomes only 1. That is, the fundamental configuration of the even order filter shown in FIG. 8 is readily changed to that of an odd order filter. As a result, the cascade connection of the fundamental circuit shown in FIG. 8 can be readily changed from a cascaded even number stage configuration to a cascaded odd number stage configuration.

Next, still another exemplary embodiment of the fundamental circuit of the present invention is shown in FIGS. 9(a) to 9(e), in which three stages of symmetrical fundamental circuits corresponding to a combination of those shown in FIGS. 6, 7 and 8 are connected in cascade together with an additional control circuit 11 supplying gate control signals $C_1$ to $C_4$ and a write signal P. The FIG. 9 embodiment will be further described with reference to Tables 6(a) and 6(b). For the sake of clarity, the connections between control circuit 11 and the respective control gates and RAMs have not been shown in FIGS. 9(a) to 9(e).

TABLE 6(a)

| | (Truth Table of fundamental circuit operation relating to FIG. 9) | | | | | | | | |
|---|---|---|---|---|---|---|---|---|---|
| | | Gate control signal | | | | | RAM | | |
| | | P | $C_1$ | $C_2$ | $C_3$ | $C_4$ | $4_1$ | $4_2$ | $4_3$ |
| 1 | Operation | | | | | | | | |
| 2 | Even number stage filter (Intermediate stage of odd number stage filter) | 0 | 0 | 0 | 0 | 0 | R | R | R |
| | Odd number stage filter | 0 | 0 | 0 | 0 | 1 | R | R | R |
| 3 | Each input output port test | 0 | 0 | 0 | 1 | 0 | R | R | R |
| 4 | RAM$4_1$ Data writing memory function test | P | 0 | 0 | 1 | 1 | W/R | R | R |
| | RAM$4_2$ Data writing memory function test | P | 0 | 1 | 0 | 0 | R | W/R | R |
| | RAM$4_3$ Data writing memory function test | P | 0 | 1 | 0 | 1 | R | R | W/R |
| 5 | Clock synchronized memory writing | P | 0 | 1 | 1 | 0 | W/R | W/R | W/R |
| 6 | Test of Adders $5_1$, $5_4$ | 0 | 0 | 1 | 1 | 1 | R | R | R |
| | Test of Adders $5_2$, $5_5$ | 0 | 1 | 0 | 0 | 0 | R | R | R |
| | Test of adders $5_3$, $5_6$ | 0 | 1 | 0 | 0 | 1 | R | R | R |

(Note)
Data derived from RAMs are outputted from resettable registers $61_a$ to $66_a$ except those reset to zero.
"P" indicates a situation where a pulse is inputted and data are written into RAM.
"R" indicates a situation where data are read out of RAM.
"W" indicates a situation where data are written into RAM.

TABLE 6(b)

(Truth Table of fundamental circuit operation relating to FIG. 9)

| | Resettable register | | | | | | | | | | | | | | | | | | | |
|---|---|---|---|---|---|---|---|---|---|---|---|---|---|---|---|---|---|---|---|---|
| | $6_{1a}$ | $6_{3a}$ | $6_{5a}$ | | | | | | | | | | | | | | | | | |
| 1 | $6_{2a}$ | $6_{4a}$ | $6_{6a}$ | $8_1$ | $8_2$ | $8_3$ | $8_4$ | $8_5$ | $8_6$ | $8_7$ | $8_8$ | $8_9$ | $8_{10}$ | $8_{11}$ | $8_{12}$ | $8_{13}$ | $8_{14}$ | $8_{15}$ | $8_{16}$ |
| 2 | — | — | — | OFF | OFF | ON | ON | OFF | OFF | OFF | ON | ON | OFF | OFF | OFF | ON | ON | OFF | OFF |
|   |   |   |   | OFF | OFF | ON | ON | OFF | OFF | OFF | ON | ON | OFF | OFF | OFF | ON | OFF | OFF | ON |
| 3 |   |   |   | OFF | ON | OFF | OFF | ON | OFF | ON | OFF | OFF | ON | OFF | ON | OFF | OFF | ON | OFF |
| 4 | — | — | — | ON | ON | OFF | OFF | ON | OFF | ON | OFF | OFF | ON | OFF | ON | OFF | OFF | ON | OFF |
|   | — | — | — | OFF | ON | OFF | OFF | ON | ON | ON | OFF | OFF | ON | OFF | ON | OFF | OFF | ON | OFF |
|   | — | — | — | OFF | ON | OFF | OFF | ON | OFF | ON | OFF | OFF | ON | ON | ON | OFF | OFF | ON | OFF |
| 5 | 0 | 0 | 0 | OFF | OFF | ON | ON | OFF | OFF | OFF | ON | ON | OFF | OFF | OFF | ON | ON | OFF | OFF |
| 6 | R | R | R | OFF | OFF | ON | ON | OFF | OFF | OFF | ON | ON | OFF | OFF | OFF | ON | ON | OFF | OFF |
|   | R | R | R | OFF | ON | OFF | OFF | ON | OFF | OFF | ON | ON | OFF | OFF | ON | OFF | OFF | ON | OFF |
|   | R | R | R | OFF | ON | OFF | OFF | ON | OFF | ON | OFF | OFF | ON | OFF | OFF | ON | ON | OFF | OFF |

Figure 9A:
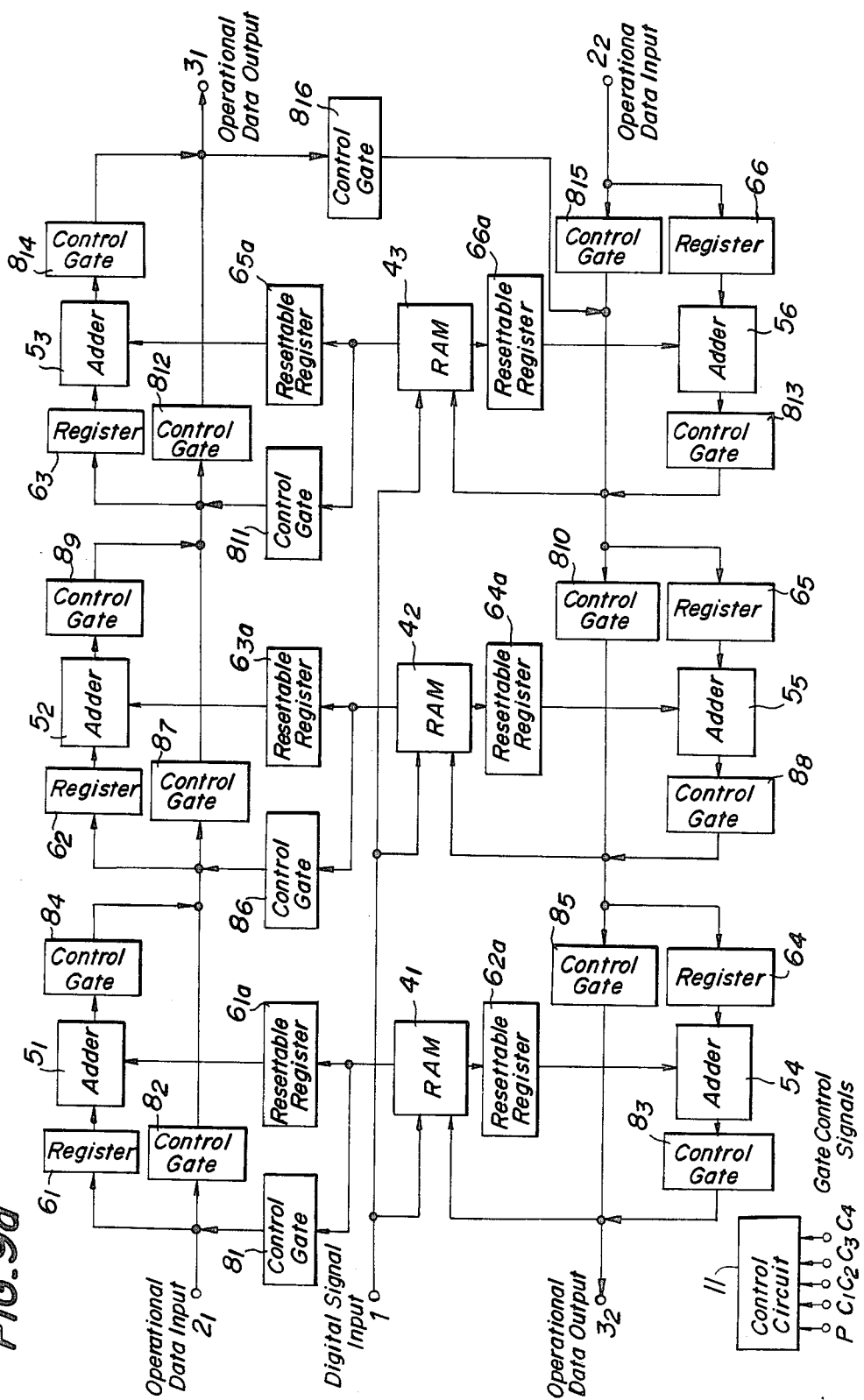
FIG. 9($a$) is a block diagram of a cascaded arrangement of a further embodiment of the fundamental circuit configuration of the present invention, and FIGS. 9($b$)–9($e$) are modified block diagrams of the embodiment of FIG. 9($a$) showing different operating modes thereof.

The fundamental circuit structure of the exemplary embodiment is shown in FIG. 9(a), and the various operating modes corresponding to the various conditions defined in Tables 6(a) and 6(b) are shown in FIGS. 9(b) to 9(e), in which inoperative (OFF) control gates and registers are denoted by the blocks containing "X"'s, and active data paths are denoted by the heavy connecting lines.

In a situation where $C_1=C_2=C_3=0$, and further when $C_4=0$, the affected fundamental circuit is ordinarily operated as either one stage of a plurality of cascaded even number stages or as an intermediate stage of a plurality of cascaded odd number stages provided for the symmetrical FIR digital filter. In the same situation but when $C_4=1$, the fundamental circuit is ordinarily operated as the end stage of a plurality of cascaded odd number stages.

Figure 9B:
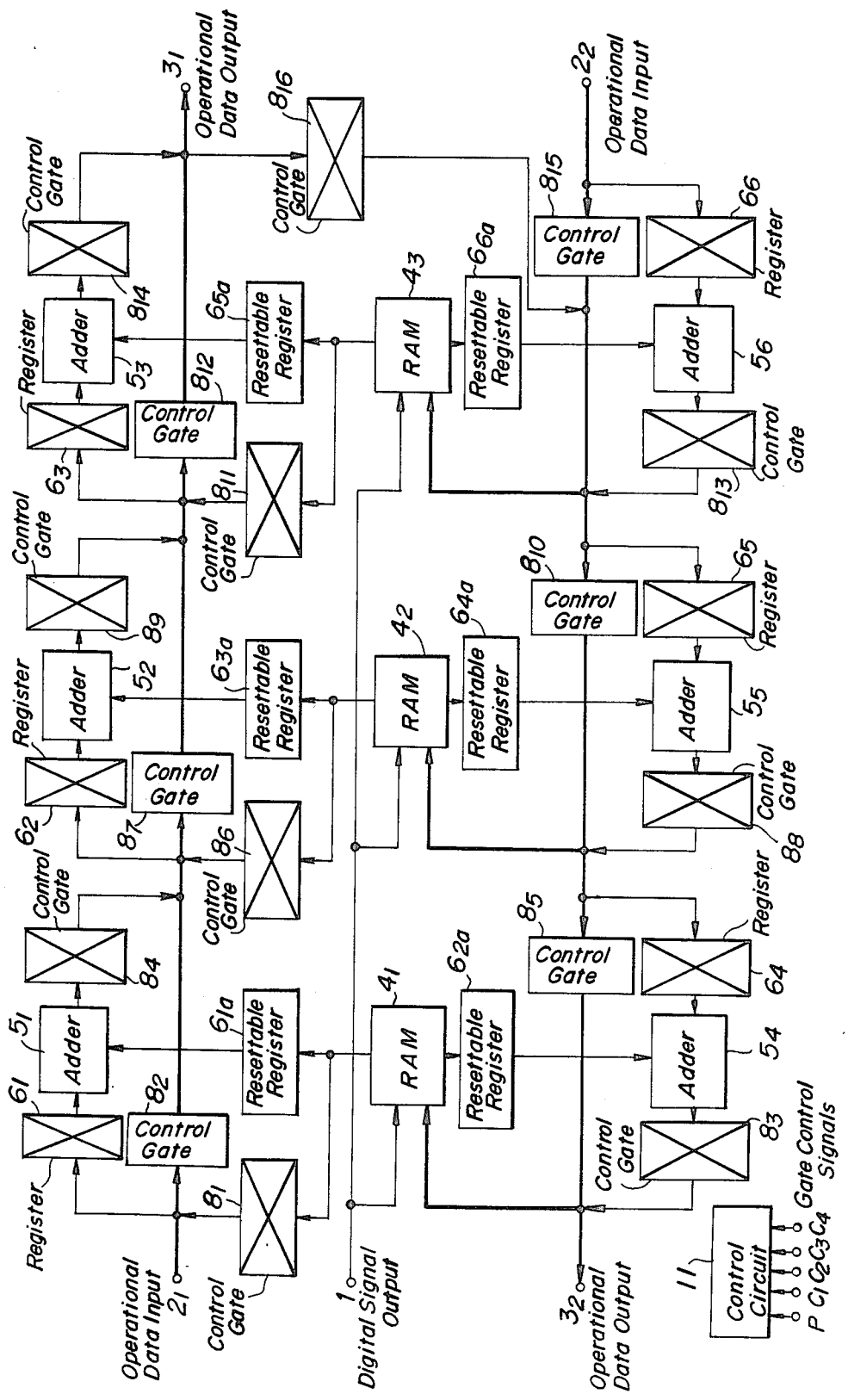

In another situation where $C_1=C_2=C_4=0$ and $C_3=1$, the control gates and registers are set in the restricted data flow configuration shown in FIG. 9(b) such that the input data are passed through each stage along the restricted active data paths between the inputs $2_1$ and $2_2$ and the output $3_1$ and $3_2$, respectively.

Figure 9C:
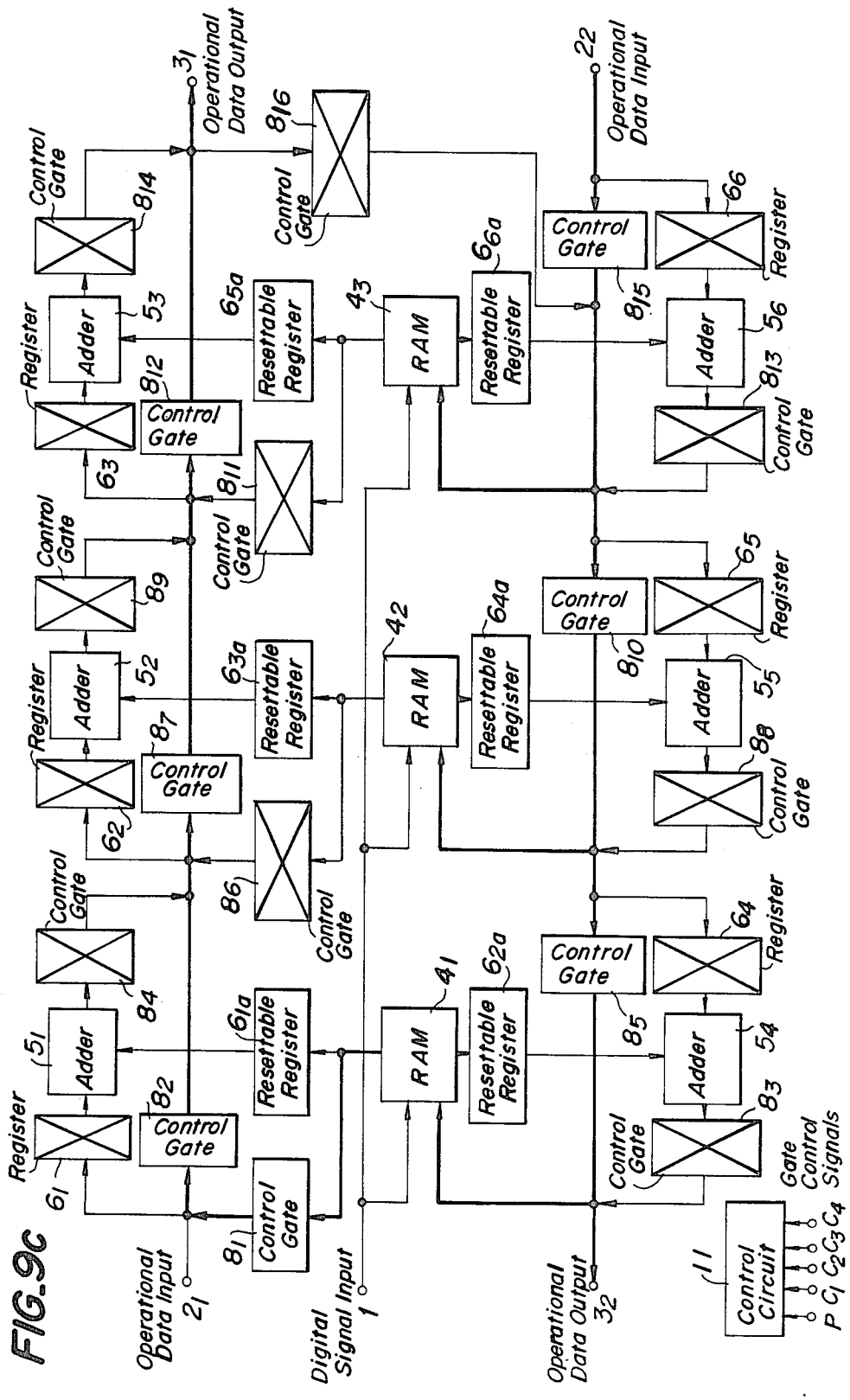

And still another situation where $C_1=C_2=0$ and $C_3=C_4=1$, the control gates and registers are set in a restricted configuration shown in FIG. 9(c) such that the memory $4_1$ can be tested. That is, the operational data can be written in the memory $4_1$ through the restricted path from the input $C_2$ and can be read out from the memory $4_1$ through the restricted path toward the output $3_1$.

In a similar fashion, when $C_1=C_3=C_4=0$ and $C_2=1$, the memory $4_2$ can be tested, and the memory $4_3$ can be tested when $C_1=C_3=0$ and $C_2=C_4=1$.

In a further situation where $C_1=C_4=0$ and $C_2=C_3=1$, the control gates and registers are set in the restricted configuration shown in FIG. 9(d) such that new data can be entered in the memories $4_1$ to $4_3$ in synchronism with the clock signal. That is, the operational data sequentially applied to the memories $4_1$ to $4_3$ from the input $2_2$ through the restricted path containing the adders $5_4$ to $5_6$ are simultaneously written into the respective memories in response to the write signal P applied thereto from the additional control circuit 11.

Further, the adders $5_1$ to $5_6$ contained in the restricted paths from the input $2_1$ to the output $3_1$ and from the input $2_2$ to the output $3_2$ can be tested by monitoring the operational data derived from the outputs $3_1$ and $3_2$, respectively.

Figure 9E:
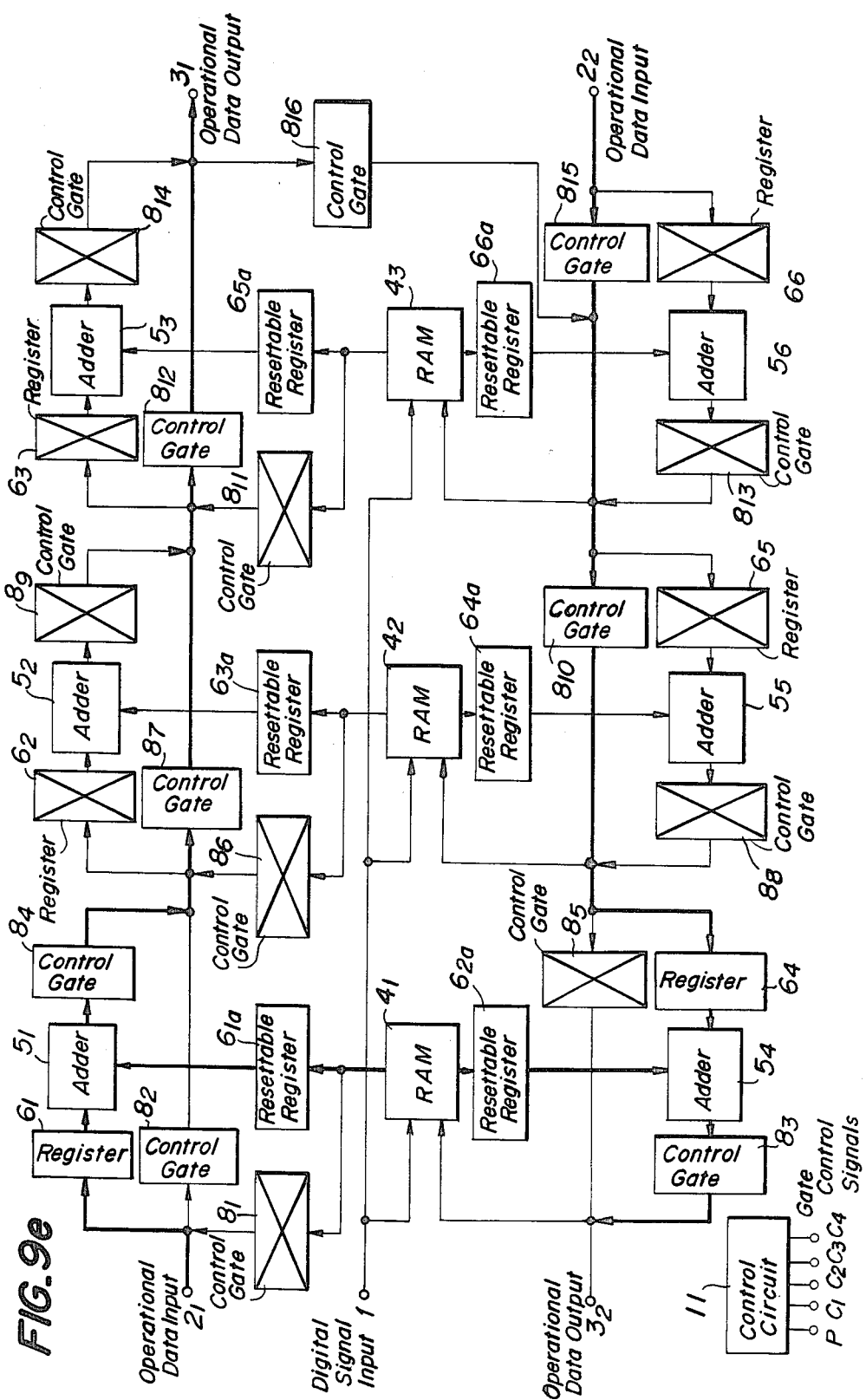

In a still further situation where $C_1=0$ and $C_2=C_3=C_4=1$, the control gates and registers are set in the restricted configuration shown in FIG. 9(e) such that the adders $5_1$ and $5_4$ can be individually tested after the test of the memory $4_1$ effected by writing test data (A) in the same. That is, the test data (A) is stored in the memory $4_1$, while test data (B) and (C) are applied to the adder $5_1$ and $5_4$ through the restricted paths from the inputs $2_1$ and $2_2$, respectively, and hence the additions (A+B) and (A+C) effected in the adders $5_1$ and $5_4$, respectively, can be individually tested by observing the resultant sums through the outputs $3_1$ and $3_2$, respectively. The other groups of adders $(5_2, 5_5)$, and $(5_3, 5_6)$ can be individually tested in a similar fashion.

In this connection, the function of the fundamental circuit shown in FIG. 9(a) can be tested as shown in FIGS. 9(b) to 9(e) respectively, so that only two kinds of simple test data need be individually prepared for testing the memory and the adder, respectively.

Lastly, the extendibility of the fundamental circuit of a FIR digital filter according to the present invention will be further described.

Figure 10:
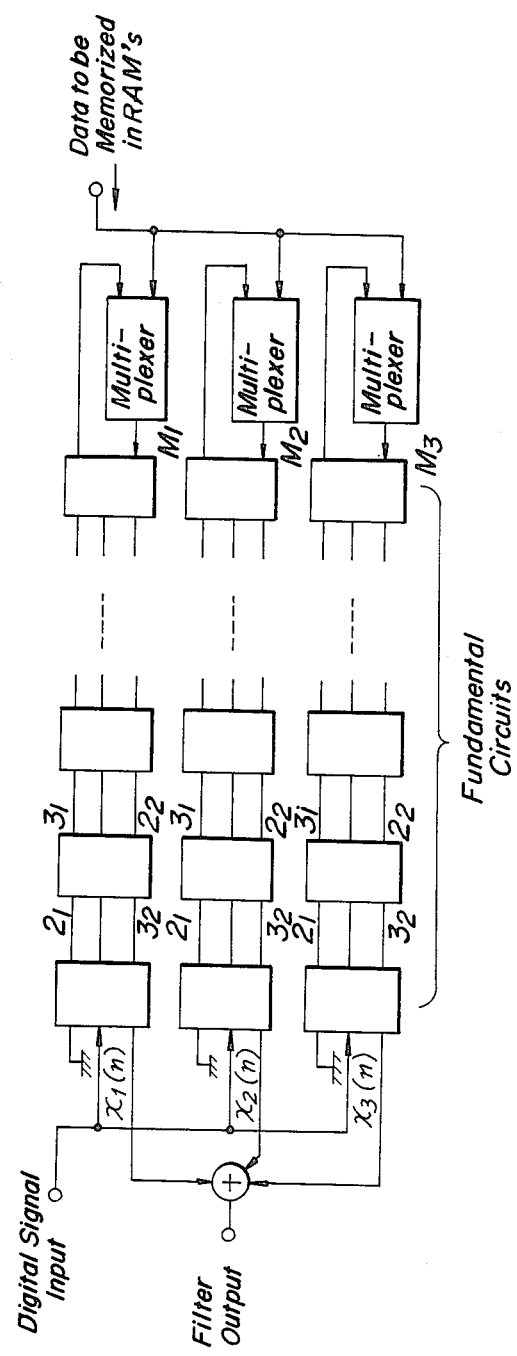
FIG. 10 is a block diagram showing a FIR digital filter of arbitrary order implemented with fundamental circuits of the present invention.

As is apparent from the foregoing, a FIR digital filter of arbitrary filter order can be realized by cascading the fundamental circuit as shown in FIG. 10. In addition thereto, the number of digits of the input digit signal to be processed through the FIR digital filter can be extended according to the present invention as follows:

The fundamental circuit shown in FIGS. 4 to 9 are adapted for processing an input digital signal of 4 digits. In order to process another input digital signal of 12 digits, it is necessary, as shown in FIG. 10, to provide a parallel connection of 3 rows of cascaded n stages of the fundamental circuits, together with multiplexers $M_1$ to $M_3$ for selecting the operational data to be stored in the respective RAM's.

In the configuration shown in FIG. 10, the operations are individually effected in each row for every 4 digits according to the following equations (3) and (4):

$$x_{(n)} = x_{1(n)} \cdot 2^8 + x_{2(n)} \cdot 2^4 + x_{3(n)} \quad (3)$$

$$y_{(n)} = a_0 x_0 + \sum_{k=1}^{(N-1)/2} a_k(x_k + x_{-k}) \quad (4)$$

$$= 2^8 \left\{ a_0 x_{1(0)} + \sum_{k=1}^{(N-1)/2} a_k(x_{1(k)} + x_{1(-k)}) \right\} +$$

$$2^4 \left\{ a_0 x_{2(0)} + \sum_{k=1}^{(N-1)/2} a_k(x_{2(k)} + x_{2(-k)}) \right\} +$$

$$\left\{ a_0 x_{3(0)} + \sum_{k=1}^{(N-1)/2} a_k(x_{3(k)} + x_{3(-k)}) \right\}$$

The filter output can be obtained by adding the individual outputs of each of the rows.

As is apparent from the foregoing detailed description, the following advantages can be obtained in accordance with the present invention:

Integrated circuit implementation of the symmetrical FIR digital filter which is frequently employed for processing digital television signals is facilitated because random access memories (RAM) can be programmably selected in place of conventional read only memories (ROM) without a significant increase in the number of external connection pins. In addition, various advantages such as data entry in the memories in synchronism with the external clock, simple testing of circuit components and programmed data, and the extension of both the number of input data digits and the filter orders can be obtained, as well as low power consumption and high speed operation.

What is claimed is:

1. A finite impulse response (FIR) digital filter producing a finite impulse response comprising a plurality of fundamental circuits connected in cascade, each of said fundamental circuits comprising:

an internal digital signal bus means for passing an input digital signal through the fundamental circuit, a memory means for renewably storing a plurality of resultant data of a multiplication between a plurality of magnitudes of said input digital signal and a plurality of filter coefficients, said plurality of resultant data being individually addressed from said memory means to obtain a resultant datum in dependence on the magnitude of said input digital signal, a first register means for temporarily storing a first operational datum derived from a preceding stage, a first adder means for adding the temporarily stored first operational datum and the resultant datum addressed from said memory means to each other, so as to form another first operational datum, a second register means for temporarily storing a second operation datum derived from a succeeding stage, a second adder means for adding the temporarily stored second operational datum and the resultant datum addressed from said memory means to each other, so as to form another second operational datum, a first control gate means connected to an internal data bus means for controlling passage of the second operational datum derived from the succeeding stage through said fundamental circuit for the preceding stage, a second control gate means for controlling connection of the another second operational datum formed by said second adder means as an output, and a control circuit means for controlling said first and said second control gate means.

2. A FIR digital filter as claimed in claim 1, said fundamental circuit further comprising:

first and second resettable register means for isolating said first adder means and said second adder means, respectively, from said memory means during input of operational data into said memory means such that said fundamental circuit can be operated as a pipe line for the passage of operational data.

3. A FIR digital filter as claimed in claim 2, wherein a plurality of said fundamental circuits connected in cascade are arranged in parallel with each other together with a plurality of multiplexer means respectively provided for multiplexing respective output data of said plurality of said fundamental circuits such that said FIR digital filter can be extended with respect to the number of digits contained in the processed data.

4. A FIR digital filter as claimed in claim 1, said fundamental circuit further comprising:

a third control gate means for controlling connection of the another first operational datum derived from said first adder means as an output for the succeeding stage, a fourth control gate means for providing a path between a first operational data input through which the first operational datum derived from the preceding stage is supplied and a first operational data output through which the another first operational datum formed by said first adder means is outputted for the succeeding stage, and a fifth control gate means for providing a path between said memory means and said first operational data input, said third, said fourth and said fifth control gate means being controlled by said control circuit means, whereby said memory means, said first adder means and said second adder means can be individually tested.

5. A FIR digital filter as claimed in claim 4, wherein a plurality of said fundamental circuits connected in cascade are arranged in parallel with each other together with a plurality of multiplexer meand respectively provided for multiplexing respective output data of said plurality of said fundamental circuits such that said FIR digital filter can be extended with respect to the number of digits contained in the processed data.

6. A FIR digital filter as claimed in claim 1, said fundamental circuit further comprising:

a sixth control gate means for providing a path between a first operational data output through which the another first operational datum formed by said first adder means is outputted and a second operational data output through which the another second operational data formed by said second adder means is outputted for the preceding stage, said sixth control gate means being controlled by said control circuit means, whereby the another first operational datum formed by said first adder means can be passed through said sixth control gate means and said second operational data output, said fundamental circuit being changed by controlling said sixth control gate from a configuration wherein the cascaded fundamental circuits are connected as even number stages in an even order FIR digital filter to a configuration wherein the cascaded fundamental circuits are connected as odd number stages in an odd order FIR digital filter.

7. A FIR digital filter as claimed in claim 6, wherein a plurality of said fundamental circuits connected in cascade are arranged in parallel with each other together with a plurality of multiplexer means respectively provided for multplexing respective output data of said plurality of said fundamental circuits such that said FIR digital filter can be extended with respect to the number of digits contained in the processed data.

8. A FIR digital filter as claimed in claim 1, said fundamental circuit further comprising:

a first resettable register means for isolating said first adder means from said memory means during predetermined processing of data by said filter, a second resettable register means for isolating said second adder means from said memory means during predetermined processing of data by said filter, a third control gate means for gating the another first operational dataum formed by said first adder means, a fourth control gate means for providing a path between a first operational data input through which the first operational datum derived from the preceding stage is supplied and a first operational data output through which the another first operational datum formed by said first adder means is outputted, and a fifth control gate means for providing a path between said memory means and said first operational data input, said third, said fourth and said fifth control gate means being controlled by said control circuit means, whereby said FIR digital filter can be extended with respect to the number of orders of the cascaded filter configuration.

9. A FIR digital filter as claimed in claim 8, wherein a plurality of said fundamental circuits connected in cascade are arranged in parallel with each other together with a plurality of multiplexer means respectively provided for multiplexing respective output data of said plurality of said fundamental circuits such that said FIR digital filter can be extended with respect to the number of digits contained in the processed data.

10. A FIR digital filter as claimed in claim 1, wherein a plurality of said fundamental circuits connected in cascade are arranged in parallel with each other together with a plurality of multiplexer means respectively provided for multiplexing respective output data of said plurality of said fundamental circuits such that said FIR digital filter can be extended with respect to the number of digits contained in the processed data.

* * * * *